(12) United States Patent
Sung et al.

(10) Patent No.: US 10,408,881 B2
(45) Date of Patent: Sep. 10, 2019

(54) METHOD AND APPARATUS FOR ESTIMATING STATE OF BATTERY

(71) Applicant: SAMSUNG ELECTRONICS CO., LTD., Suwon-si (KR)

(72) Inventors: Jaemo Sung, Hwaseong-si (KR); Jeonghyun Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 697 days.

(21) Appl. No.: 15/010,977

(22) Filed: Jan. 29, 2016

(65) Prior Publication Data

US 2016/0231386 A1  Aug. 11, 2016

(30) Foreign Application Priority Data

Feb. 6, 2015  (KR) .................. 10-2015-0018828

(51) Int. Cl.
*G01R 31/367* (2019.01)
*G01R 31/382* (2019.01)

(52) U.S. Cl.
CPC ......... *G01R 31/367* (2019.01); *G01R 31/382* (2019.01)

(58) Field of Classification Search
CPC .............. G06N 99/005; G01R 31/36–31/3696
USPC .............. 320/132; 324/425–437; 702/63–64; 706/16–25
See application file for complete search history.

(56) References Cited

U.S. PATENT DOCUMENTS

| 6,259,084 B1* | 7/2001 | Kochis ................ H04N 1/047 250/208.1 |
| 8,334,699 B2 | 12/2012 | Asakura et al. |
| 8,412,658 B2* | 4/2013 | Song .................. G01R 31/3651 324/426 |
| 2002/0103626 A1* | 8/2002 | Zhao ..................... G06F 17/148 702/190 |
| 2015/0046109 A1* | 2/2015 | Miwa .................. G01R 31/3646 702/63 |

FOREIGN PATENT DOCUMENTS

| JP | 2008-170196 A | 7/2008 |
| JP | 2010-164329 A | 7/2010 |
| JP | 2011-233414 A | 11/2011 |
| KR | 10-2007-0077871 A | 7/2007 |
| KR | 10-2010-0116030 A | 10/2010 |
| KR | 10-2012-0035537 A | 4/2012 |

OTHER PUBLICATIONS

Perone ("Battery Lifetime Prediction by Pattern Recognition—Application to Lead-Acid Battery Life-Cycling Test Data"; Sep. 1983; Office of Naval Research; Technical Report No. 4).*
Cervone et al. (A Fast and Accurate Battery Model Suitable for Production Profiling in Smart Grids; 2012; MEDPOWER 2012; p. 2).*
He, Wei et al., "State of charge estimation for electric vehicle batteries using unscented kalman filtering", *Microelectronics Reliability*, vol. 53, Issue 6, Jun. 2013, pp. 840-847. (8 pages, in English).

* cited by examiner

*Primary Examiner* — Melissa J Koval
*Assistant Examiner* — Rahul Maini
(74) *Attorney, Agent, or Firm* — NSIP Law

(57) ABSTRACT

A battery state estimating apparatus includes a learner configured to learn a battery state estimation model comprising a label corresponding to a battery state; and a state estimator configured to estimate a battery state of a target battery using the battery state estimation model.

20 Claims, 11 Drawing Sheets

METHOD AND APPARATUS FOR ESTIMATING STATE OF BATTERY

CROSS-REFERENCE TO RELATED APPLICATION(S)

This application claims the benefit under 35 USC 119 (a) of Korean Patent Application No. 10-2015-0018828 filed on Feb. 6, 2015, in the Korean Intellectual Property Office, the entire disclosure of which is incorporated herein by reference for all purposes.

BACKGROUND

1. Field

The following description relates to a method and an apparatus for estimating a state of a battery.

2. Description of Related Art

A battery of an electric vehicle serves the function of a fuel tank of a gasoline-powered vehicle, and thus verifying a state of the battery is important for the safety of a user or a driver of the electric vehicle.

Recently, ongoing research has been conducted on a method of increasing user convenience while verifying a state of a battery more accurately. A battery state estimation model associated with a state of charge (SoC), a state of health (SoH), and a fault state of a battery may be constructed in a high-dimensional time-series data space using a battery sensor signal associated with a voltage, a current, a temperature, and a pressure, and other variables.

However, an existing battery state estimation model necessitates a large amount of computation due to handling of high-dimensional time-series input data. Thus, real-time battery state estimation cannot be readily performed by a battery management system (BMS) having limited computational resources.

An original time-series signal of a voltage, a current, and a temperature of a battery may be affected by a complex action of chemical elements in the battery. Thus, unnecessary information may also be included in addition to necessary information on a state of the battery to be estimated. Accordingly, a complex estimation model may be needed to obtain a battery state estimating performance at a certain level or higher.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery state estimating apparatus includes a learner configured to learn a battery state estimation model including a label corresponding to a battery state; and a state estimator configured to estimate a battery state of a target battery using the battery state estimation model.

The learner may include a segment data generator configured to generate segment data by segmenting a battery sensor signal of a reference battery based on a predetermined time interval; a labeler configured to assign, to each of the segment data, a respective label corresponding to the battery state; and a pattern extractor configured to extract a feature pattern of each label from the labeled segment data.

The learner may further include a battery state estimation model generator configured to generate, as the battery state estimation model, a feature space transformation model corresponding to the feature pattern of each label using a discriminant analysis method.

The battery sensor signal may include any one or any combination of any two or more of voltage data, current data, temperature data, and pressure data of the reference battery in a time-series space.

The segment data generator may include a preprocessor configured to correct the battery sensor signal at a fixed sampling interval before the segmenting of the battery sensor signal.

The state estimator may include a segment data generator configured to generate segment data by segmenting a battery sensor signal of the target battery based on a predetermined time interval; a pattern matcher configured to perform pattern matching between the battery state estimation model and the segment data of the target battery; and a battery state estimator configured to estimate the battery state of the target battery based on a result of the pattern matching.

The pattern matcher may be further configured to perform the pattern matching between a feature pattern of a battery state estimation model corresponding to a battery state to be estimated and a data pattern of the segment data of the target battery; and the battery state estimator may be further configured to estimate, as the battery state of the target battery, a battery state corresponding to a feature pattern most closely matching the data pattern of the segment data of the target battery.

The battery state may include a state of charge (SoC); the learner may be further configured to learn an SoC estimation model including SoC labels respectively corresponding to SoC sections based on a predetermined interval; and the state estimator may be further configured to estimate an SoC of the target battery by comparing the SoC estimation model to segment data of the target battery obtained by segmenting a battery sensor signal of the target battery based on a predetermined time interval.

The learner may be further configured to extract a feature pattern of each SoC label from the SoC estimation model; and the state estimator may be further configured to perform pattern matching between a data pattern of the segment data and the feature pattern of each SoC label, and estimate, as the SoC of the target battery, an SoC section corresponding to a feature pattern most closely matching the data pattern of the segment data.

The learner may include a sensor state estimation model learner configured to learn a sensor state estimation model including labels respectively corresponding to sensor states; and the state estimator may include a sensor state estimator configured to estimate a sensor state of a sensor measuring a battery sensor signal of the target battery using the sensor state estimation model.

The learner may further include a sensor state feature pattern extractor configured to extract a feature pattern of each of the labels corresponding to the sensor states; and the sensor state estimator may be further configured to perform pattern matching between the feature pattern of each of the labels corresponding to the sensor states and a data pattern of segment data of the target battery obtained by segmenting the battery sensor signal of the target battery based on a predetermined time interval, and estimate a sensor state corresponding to the feature pattern as the sensor state of the sensor measuring the battery sensor signal of the target battery based on a result of the pattern matching.

In another general aspect, a battery state estimating method includes learning a battery state estimation model including a label corresponding to a battery state; and estimating a battery state of a target battery using the battery state estimation model.

The learning of the battery state estimation model includes generating segment data by segmenting a battery sensor signal of a reference battery based on a predetermined time interval; assigning, to each of the segment data, a label corresponding to the battery state; and extracting a feature pattern of each label from the labeled segment data.

The learning of the battery state estimation model may further include generating, as the battery state estimation model, a feature space transformation model corresponding to the feature pattern using a discriminant analysis method.

The estimating of the battery state may include generating segment data by segmenting a battery sensor signal of the target battery based on a predetermined time interval; performing pattern matching between the battery state estimation model and the segment data of the target battery; and estimating the battery state of the target battery based on a result of the pattern matching.

The performing of the pattern matching may include performing pattern matching between a feature pattern of a battery state estimation model corresponding to a battery state to be estimated and a data pattern of the segment data of the target battery; and the estimating of the battery state may include estimating, as the battery state of the target battery, a battery state corresponding to a feature pattern most closely matching the data pattern of the segment data of the target battery.

The battery state may include a state of charge (SoC); the learning of the battery state estimation model may include learning an SoC estimation model including SoC labels respectively corresponding to SoC sections based on a predetermined interval; and the estimating of the battery state may include estimating an SoC of the target battery by comparing the SoC estimation model to segment data of the target battery obtained by segmenting a battery sensor signal of the target battery based on a predetermined time interval.

The learning of the battery state estimation model may include extracting a feature pattern of each SoC label from the SoC estimation model; and the estimating of the battery state further may include performing pattern matching between a data pattern of the segment data and the feature pattern of each SoC label; and estimating, as the SoC of the target battery, an SoC section corresponding to a feature pattern most closely matching the data pattern of the segment data.

The learning of the battery state estimation model may include learning a sensor state estimation model including labels respectively corresponding to sensor states; and the estimating of the battery state may include estimating a sensor state of a sensor measuring a battery sensor signal of the target battery using the sensor state estimation model.

The learning of the sensor state estimation model may include extracting a feature pattern of each of the labels corresponding to the sensor states; and the estimating of the sensor state may include performing pattern matching between the feature pattern of each of the labels corresponding to the sensor states and a data pattern of segment data of the target battery obtained by segmenting the battery sensor signal of the target battery based on a predetermined time interval; and estimating a sensor state corresponding to the feature pattern as the sensor state of the sensor measuring the battery sensor signal of the target battery based on a result of the pattern matching.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations is described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terminology used herein is for the purpose of describing particular examples only, and is not intended to limit the disclosure. As used herein, the singular forms "a," "an," and "the" are intended to include the plural forms as well, unless the context clearly indicates otherwise. The terms "include" "have," when used in this specification, specify the presence of stated features, numbers, operations, elements, components or combinations thereof, but do not preclude the presence or addition of one or more other features, numbers, operations, elements, components, or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Figure 1:
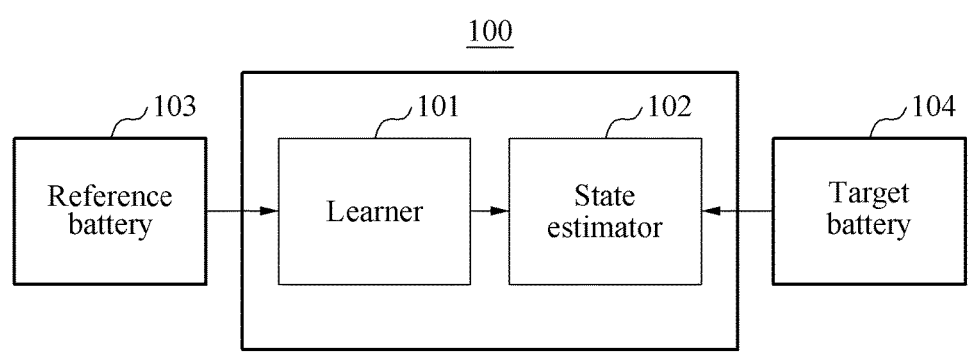
FIG. 1 is a diagram illustrating an example of a battery state estimating apparatus.

FIG. 1 is a diagram illustrating an example of a battery state estimating apparatus 100. The battery state estimating apparatus 100 described herein is an apparatus for estimating a state of a battery.

Referring to FIG. 1, the battery state estimating apparatus 100 includes a learner 101 and a state estimator 102. The learner 101 learns a battery state estimation model including a battery sensor signal sensed from a reference battery 103 and a label corresponding to a battery state. The reference battery 103 may be any type of battery.

The state estimator 102 receives the battery state estimation model learned by the learner 101, and estimates a battery state of a target battery 104 using the battery state estimation model and a battery sensor signal of the target battery 104.

The battery state includes any one of or any combination of any two or more of a state of abnormality, a fault state, a state of function (SoF), a state of charge (SoC), and a state of health (SoH). The SoH is a degree of deterioration in a performance of a battery compared to a performance of the battery at a time of manufacture. The SoC is information on a remaining quantity of charge stored in a battery. The SoF is information on a degree of suitability of a performance of a battery for a predetermined condition.

The learner 101 learns the battery state estimation model including the battery sensor signal and the label corresponding to the battery state. The learner 101 generates labeled segment data using segment data obtained by segmenting the battery sensor signal and the label corresponding to the battery state, and extracts a feature pattern of each label corresponding to each battery state. The learner 101 generates the battery state estimation model corresponding to the feature pattern and learns the generated battery state estimation model. The learner 101 generates a feature space transformation model using the extracted feature pattern.

The battery state estimation model learned based on the label corresponding to the battery state is used as input data for the state estimator 102.

The learner 101 will be further described with reference to FIG. 2.

The state estimator 102 estimates the battery state of the target battery 104. The state estimator 102 estimates the battery state of the target battery 104 by performing pattern matching between the battery state estimation model learned by the learner 101 and segment data obtained by segmenting a battery sensor signal of the target battery 104.

The state estimator 102 will be further described with reference to FIG. 3.

Figure 2:
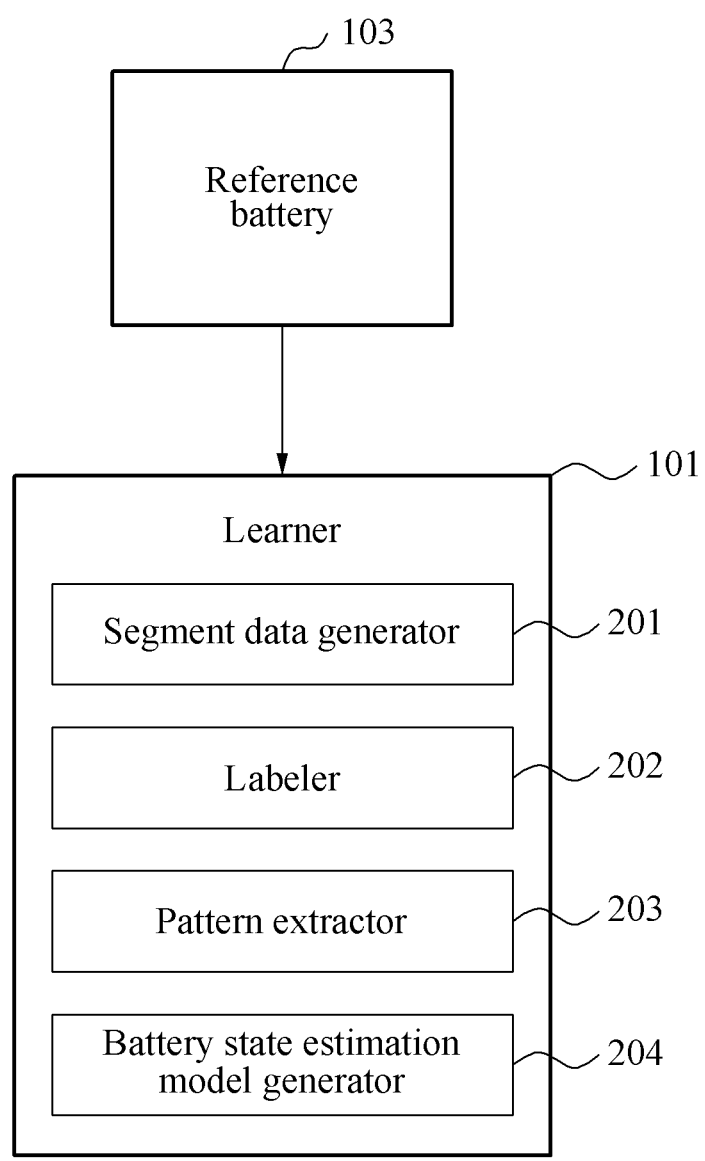
FIG. 2 is a diagram illustrating an example of a learner of a battery state estimating apparatus.

FIG. 2 is a diagram illustrating an example of the learner 101 of the battery state estimating apparatus 100 of FIG. 1.

Referring to FIG. 2, the learner 101 includes a segment data generator 201, a labeler 202, a pattern extractor 203, and a battery state estimation model generator 204. The learner 101 learns a battery state estimation model using a battery sensor signal sensed from a reference battery 103. A sensor sensing the battery sensor signal of the reference battery 103 may be included in the battery state estimating apparatus 100. Alternatively, the sensor sensing the battery sensor signal of the reference battery 103 may be disposed outside the battery state estimating apparatus 100, and the learner 101 may receive the battery sensor signal of the reference battery 103 sensed by the sensor through wired or wireless communication.

The segment data generator 201 generates segment data by segmenting the battery sensor signal sensed from the reference battery 103 at a predetermined time interval. The battery sensor signal is sensed by the sensor sensing the reference battery 103, and includes any one or any combination of any two or more of voltage data, current data, temperature data, and pressure data of the reference battery 103.

The battery sensor signal is a time-series signal sensed at a predetermined time interval, for example, a sampling time, during a predetermined time section. In one example, the segment data generator 201 generates the segment data by segmenting a time-series battery sensor signal sensed by a voltage sensor at a one second interval.

The segment data generator 201 may include a preprocessor configured to correct the battery sensor signal at a fixed sampling interval. The preprocessor may correct the battery sensor signal at the fixed sampling interval before segmenting the battery sensor signal into the segment data to force the battery sensor signal to have a predetermined amplitude for a predetermined period of time.

The labeler 202 assigns a label corresponding to a battery state to the segment data. The battery state includes any one or any combination of any two or more of an SoH, an SoC, an SoF, and a fault state. The labeler 202 generates labeled segment data by assigning the label corresponding to the battery state to the segment data. For example, when the battery state of the segment data is an error state, an error state label is assigned to the segment data to generate the labeled segment data.

The pattern extractor 203 extracts a feature pattern of each label from the labeled segment data including a label corresponding to a battery state of each set of the segment data. For example, the pattern extractor 203 extracts a discriminant feature pattern from sets of the labeled segment data corresponding to a battery state to be estimated. For example, when the battery state to be estimated is an error state, the pattern extractor 203 extracts a feature pattern from the labeled segment data including an error state label.

The battery state estimation model generator 204 is configured to generate a battery state estimation model corresponding to the feature pattern of each label using a discriminant analysis method. The battery state estimation model generator 204 generates a feature space transformation model. Using the discriminant analysis method, the battery state estimation model generator 204 generates the feature space transformation model associated with the battery state to be estimated based on collected sets of the labeled segment data. The battery state estimation model generator 204 generates, as the battery state estimation model, the feature space transformation model generated using the discriminant analysis method.

The battery state estimation model generator 204 generates, in advance, the battery state estimation model through experimental representation of the battery state to be estimated. For example, when the battery state to be estimated is an error state, the battery state estimation model is generated using the reference battery 103 in the error state. The learner 101 generates the battery state estimation model using a battery sensor signal in the error state and learns the generated battery state estimation model. The feature space transformation model is generated by extracting a feature pattern of the battery sensor signal in the error state.

In another example, the battery state estimation model is generated in real time based on a battery state and a battery sensor signal that are measured in real time. When the battery state measured in real time is a new battery state, the learner 101 adds a label corresponding to the new battery state to the existing labeled segment data to construct a more detailed battery state estimation model, and relearns the battery state estimation model.

The segment data generator 201 generates the labeled segment data by segmenting the battery sensor signal. The battery sensor signal becomes the segment data after the preprocessing and the segmenting. An SoC is divided into labels corresponding to each battery state. A set "D" of the labeled segment data is generated as expressed in Equation 1 below by assigning a label corresponding to a battery state to segmented data of the battery sensor signal.

$$D=\{(Y_i, X_i)\}, i=1, \ldots N, \quad (1)$$

In Equation 1, "D" denotes a set of labeled segment data, "Y," denotes a label corresponding to a battery state, and "$X_i$" denotes segment data of a battery sensor signal corresponding to the battery state.

In one example, a target-oriented feature space transformation model is learned using the generated labeled segment data. The feature space transformation model is defined as expressed in Equation 2 below.

$$Z=f(X;\theta) \quad (2)$$

In Equation 2, "Z" denotes a feature space transformation model, "X" denotes segment data of a battery sensor signal as an input signal, "θ" denotes a feature pattern. Using Equation 2, a transformation may be made from a high-dimensional input battery sensor segment data space to a low-dimensional feature space.

The feature space transformation model is generated using the segment data and the feature pattern corresponding to the battery state to be estimated. Thus, a discriminant feature model ""Z=f(X; θ*)" is generated.

An objective function "$J_f$" is obtained using Equation 3 below using the sets of the labeled segment data.

$$J_f = \frac{\gamma * \text{Between Scatter Score } (\theta; D)}{(1-\gamma) * \text{Within Scatter Score } (\theta; D)} \quad (3)$$

In Equation 3, a "Between Scatter Score" function is used to measure a degree of dense distribution of sets of segment data of a battery sensor signal corresponding to each label of a same battery state in the feature space. A "Within Scatter Score" function is used to measure a degree of sparse distribution of the sets of the segment data having labels of different battery states. The sets of the labeled segment data include information as to which battery state the segment data of the battery sensor signal actually belongs to through the Between Scatter Score function and the Within Scatter Score function. In addition, a "γ" parameter denotes a parameter used to set a weight of the scattering and density for the learning.

In one example, the learner 101 learns an optimal model parameter "θ*" used to maximize the objective function using Equation 4 below.

$$\theta^* = \arg\max_\theta J_f(\theta; D) \quad (4)$$

In one example, the feature space transformation model, which may more desirably discriminate a battery state to be estimated in the low-dimensional feature space, is obtained. A most general method includes defining a linear feature space transformation model as in Z=W*X, and a linear discriminant analysis method is used.

Figure 3:
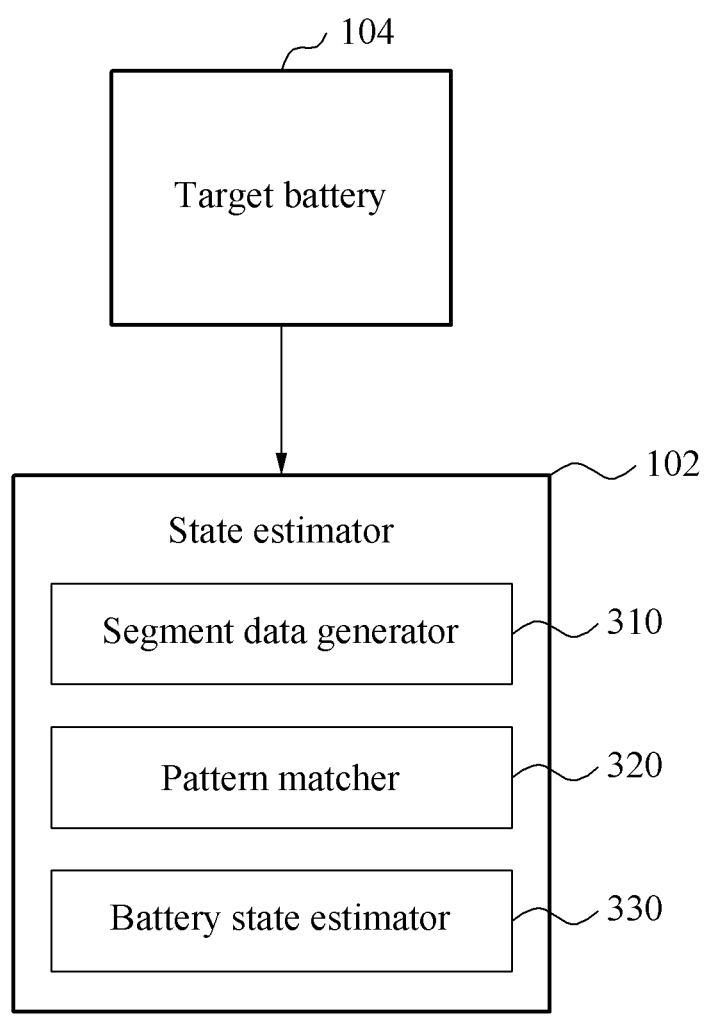
FIG. 3 is a diagram illustrating an example of a state estimator of a battery state estimating apparatus.

FIG. 3 is a diagram illustrating an example of the state estimator 102 of the battery state estimating apparatus 100 of FIG. 1.

Referring to FIG. 3, the state estimator 102 includes a segment data generator 310, a pattern matcher 320, and a battery state estimator 330. The state estimator 102 estimates a battery state of a target battery 104 using a battery sensor signal sensed from the target battery 104. The battery sensor signal may be sensed by a sensor included in the battery state estimating apparatus 100. Alternatively, the battery sensor signal may be sensed by an external sensor outside the battery state estimating apparatus 100. The battery sensor signal includes any one or any combination of any two or more of voltage data, current data, temperature data, and pressure data of the target battery 104.

The segment data generator 310 generates segment data by segmenting the battery sensor signal sensed from the target battery 104 at a predetermined time interval.

The segment data generator 310 may include a preprocessor configured to perform preprocessing, for example, by correcting the battery sensor signal at a fixed sampling interval. Alternatively, the preprocessor may be disposed outside the battery state estimating apparatus 100, for example, in a personal computer (PC), a server, or a cloud.

The pattern matcher 320 performs pattern matching between a battery state estimation model corresponding to a battery state to be estimated and the battery sensor signal sensed from the target battery 104. The pattern matcher 320 performs the pattern matching between a feature space transformation model corresponding to a feature pattern of the battery state to be estimated and the segment data of the target battery 104.

The pattern matcher 320 measures a degree of similarity between the battery sensor signal sensed from the target battery 104 and the feature space transformation model of each battery state learned by the learner 101 of FIG. 1. The pattern matcher 320 transmits, to the battery state estimator 330, a label corresponding to a most closely matching battery state.

The pattern matcher 320 estimates a current battery state by calculating a Euclidean distance between the label corresponding to the battery state and the learned feature pattern, and estimating the current battery state as a battery state label having a shortest distance. Alternatively, the pattern matching may be performed using a support vector machine (SVM) classifier, a neural network classifier, a decision tree classifier, a linear or non-linear regression method, or any other pattern matching method known to one of ordinary skill in the art.

The battery state estimator 330 estimates the battery state of the target battery 104 based on a result of the pattern matching. In one example, the battery state estimator 330 estimates the current battery state using the label corresponding to the most closely matching battery state received from the pattern matcher 320.

In another example, when a battery state estimation model corresponding to a battery state to be estimated matches segment data of a battery sensor signal obtained in real time, the battery state estimator 330 estimates, as the battery state of the target battery 104, the battery state corresponding to the battery state estimation model.

The battery state estimator 330 estimates, in real time, the battery state of the segment data of the battery sensor signal using a pre-learned optimal feature space transformation model. The pre-learned feature space transformation model is obtained by the learner 101.

The state estimator 102 stores, in a database, a battery state estimation model based on a type of a battery state. Thus, an amount of computation and a time consumed by the battery state estimating apparatus 100 to estimate the battery state of the target battery 104 is reduced. In one example, when a new type battery sensor signal of the target battery 104 is input, the state estimator 102 updates information in the database on a battery state estimation model corresponding to a type of a battery state using the new type battery sensor signal.

In one example, the state estimator 102 estimates a battery state using a battery sensor signal. The battery state includes a normal state, an abnormal state, and a fault state. The normal state is a state in which the target battery 104 performs a normal function. The abnormal state is a state in which the target battery 104 operates, but does not perform the normal function. The fault state is a state in which the target battery 104 does not operate. For example, the abnormal state and the fault state include overcharging, overdischarging, thermal runaway, explosion, contact error, power reduction, and other abnormal and fault states of the target battery 104. The abnormal state and the fault state may occur due to other various causes. For example, the abnormal state and the fault state may occur due to a chemical reaction occurring in the target battery 104 based on a type of the target battery 104, environmental factors such as an ambient temperature and a humidity of an environment of the target battery 104, and other various errors in charging and discharging the target battery 104.

Figure 4:
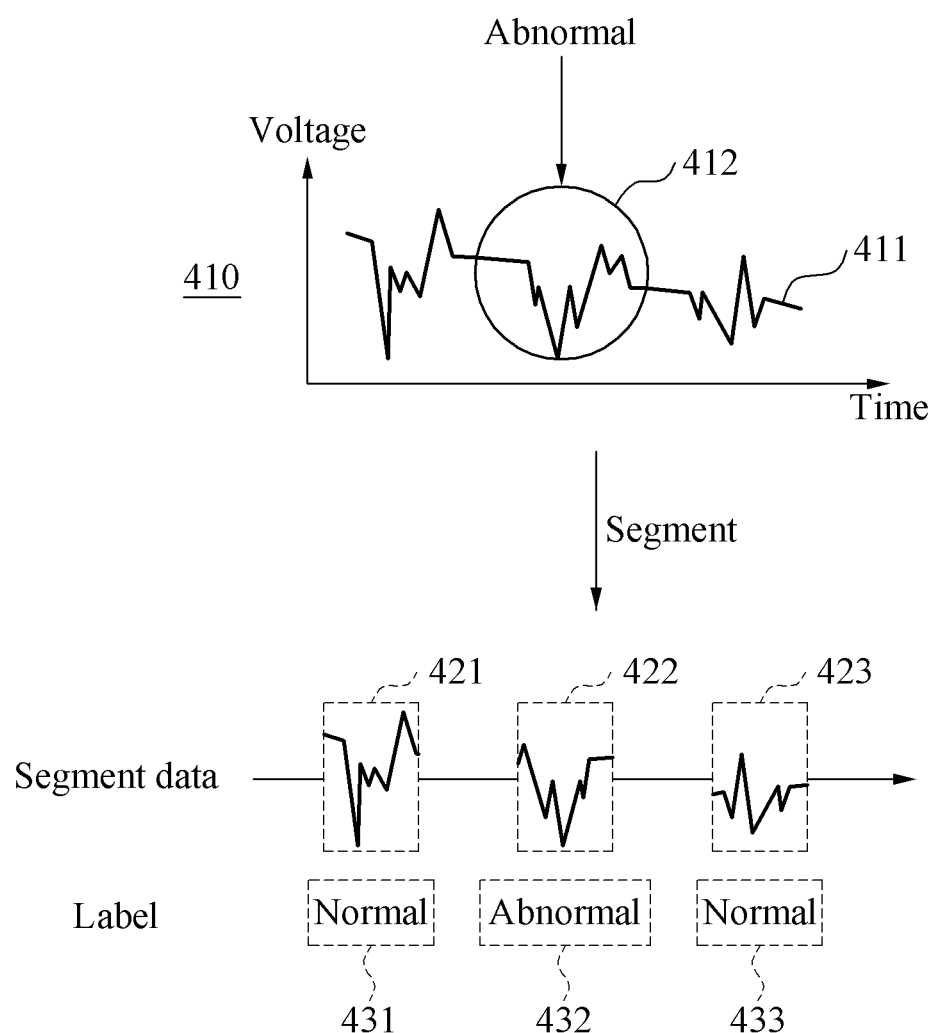
FIG. 4 illustrates an example of labeled segment data.

FIG. 4 illustrates an example of labeled segment data.

Referring to FIG. 4, a battery sensor signal 411 indicated in a graph 410 is segmented to generate sets of segment data, for example, segment data 421, segment data 422, and segment data 423. Labels, for example, a label 431, a label 432, and a label 433, corresponding to each battery state are respectively assigned to the sets of the segment data 421, 422, and 423.

In one example, the sets of the segment data 421, 422, and 423 are generated by segmenting the battery sensor signal 411. In the example of FIG. 4, a circle indicates a section 412 of a battery sensor signal in an abnormal state.

The labels 431, 432, and 433 corresponding to each battery state are assigned to the sets of the segment data 421, 422, and 423, respectively, to generate sets of labeled segment data. The battery sensor signal 411 obtained from a battery is a time-series battery sensor signal. For example, the battery sensor signal 411 may be a voltage signal of the battery that changes over time.

The time-series battery sensor signal 411 is segmented at a predetermined time interval to generate the sets of the segment data 421, 422, and 423.

A label, for example, the label 431, the label 432, and the label 433, corresponding to a battery state of each set of the segment data is assigned to a corresponding set of the segment data.

For example, the section 412 of the battery sensor signal 411 is a section of the battery sensor signal 411 corresponding to the abnormal state. Thus, the section 412 belongs to the segment data 422, and the label 432 corresponding to the abnormal state is assigned to the segment data 422.

In the example of FIG. 4, sections of the battery sensor signal 411 other than the section 412 are sections of the battery sensor signal 411 corresponding to a normal state. Thus, a battery sensor signal section of the battery sensor signal 411 corresponding to the normal state belongs to sets of the segment data 421 and 423, and the labels 431 and 433 corresponding to the normal state are respectively assigned to the sets of the segment data 421 and 423.

Although FIG. 4 illustrates the labels 431, 432, and 433 corresponding to a battery state associated with a state of abnormality, a type of the battery state may be associated with information on a fault state, an SoC, an SoH, an SoF, and other factors. A battery state label of "normal" indicates that a battery is in a normal state. Conversely, a battery state label of "abnormal" indicates that the battery is in an abnormal state.

A label corresponding to a battery state of segment data is assigned to the segment data, and thus labeled segment data is generated.

Figure 5A:
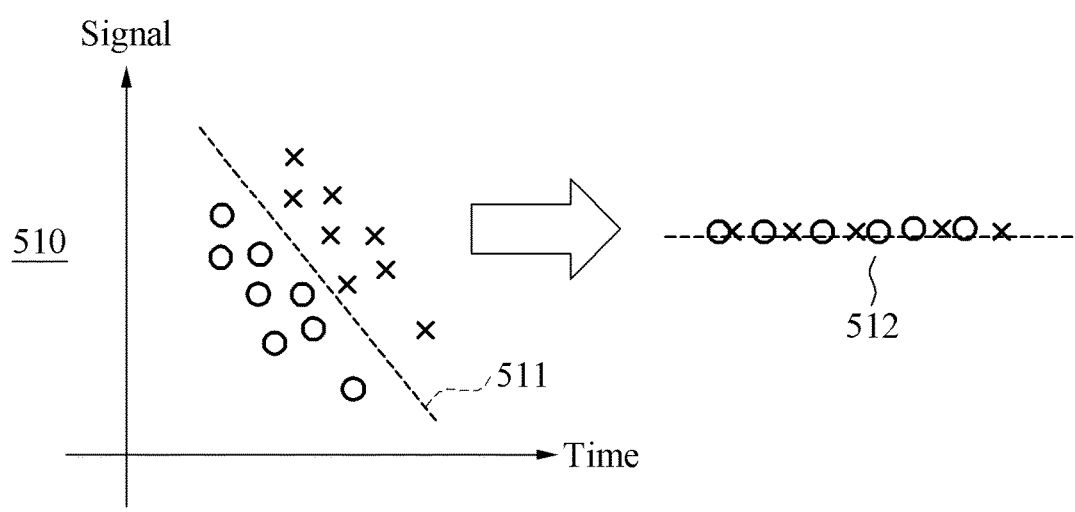
FIGS. 5A and 5B illustrate an example of an effect of feature extraction using a label.
Figure 5B:
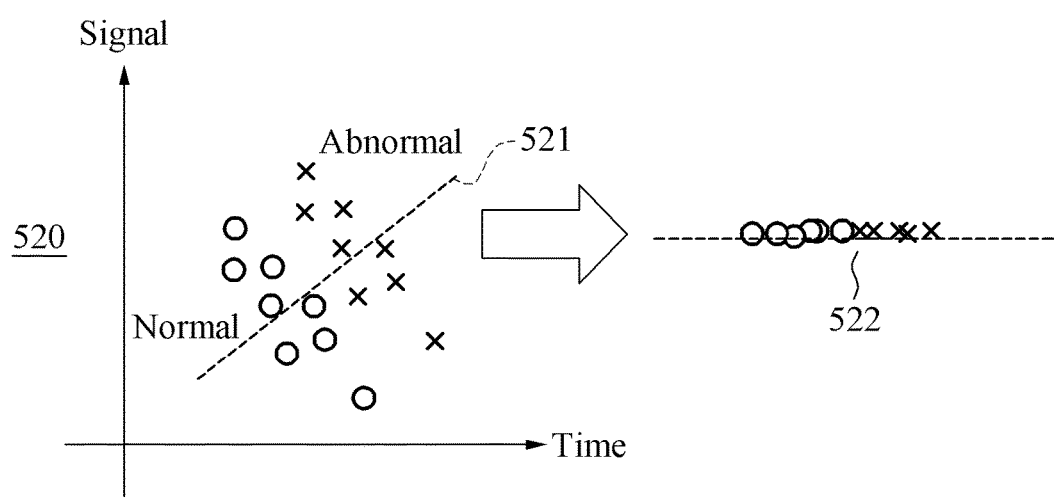

FIGS. 5A and 5B illustrate an example of an effect of feature extraction using a label.

FIGS. 5A and 5B illustrate a comparison of a principal component analysis to a linear discriminant analysis. The principal component analysis is a learning method that does not use label information, and the linear discriminant analysis is a learning method that uses label information.

Referring to FIG. 5A, the principal component analysis includes projecting segment data in a graph 510 in a data space onto a predetermined principal component analysis-based matrix 511 to obtain a graph in a feature space 512. For example, when a battery state is associated with a fault state, segment data corresponding to a normal state is indicated by "o" in the graph 510 in the data space, and segment data corresponding to a fault state is indicated by "x" in the graph 510 in the data space. When the segment data in the graph 510 in the data space is projected onto the matrix 511 to be mapped to the feature space 512 without using label information, sets of the segment data in the feature space 512 are mixed, and thus a battery state cannot be readily determined.

Referring to FIG. 5B, the linear discriminant analysis includes projecting segment data in a graph 520 in a data space onto a predetermined linear discriminant analysis-based matrix 521 to obtain a graph in a feature space 522. For example, when a battery state is associated with a fault state, segment data corresponding to a normal state is indicated by "o" in the graph 520 in the data space, and segment data corresponding to a fault state is indicated by "x" in the graph 520 in the data space. When the segment data in the graph 520 in the data space is projected onto the matrix 521 to be mapped to the feature space 522 using label information, sets of the segment data in the feature space 522 are not mixed, and this a battery state can be readily determined.

Thus, using the label information, segment data of a battery sensor signal may be defined as a feature space transformation model, and parameters in a low-dimensional feature space are learned to maximally discriminate sets of labeled segment data including different labels. That is, in the transformed feature space, sets of data including the same battery state label are clustered together, and sets of data including different battery state labels are scattered over a farther distance.

Figure 6:
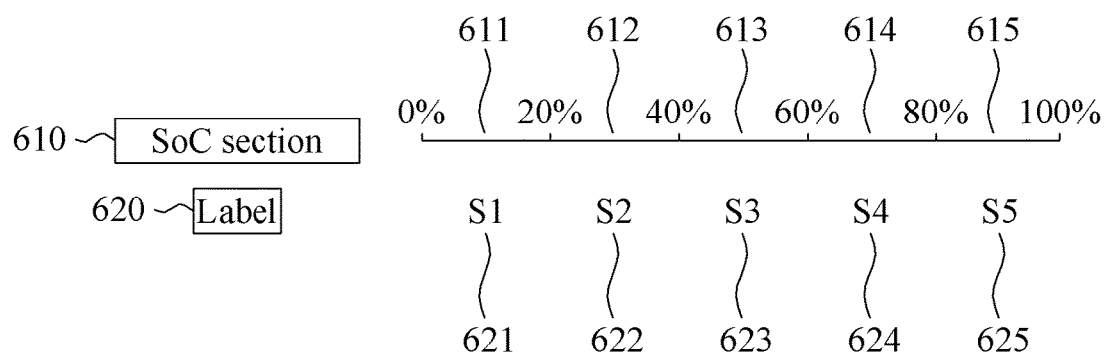
FIG. 6 illustrates an example of a state of charge (SoC) section and an SoC label for estimating an SoC.

FIG. 6 illustrates an example of an SoC section 610 and an SoC label 620 for estimating an SoC.

Referring to FIG. 6, the SoC section 610 is segmented at a predetermined interval, and the SoC label 620 corresponding to the SoC section 610 is defined. For example, as illustrated in FIG. 6, the SoC section 610 corresponding to a 0 to 100% SoC range is segmented at a 20% interval into five sections 611 through 615, and respective labels 621 (S1) through 625 (S5) corresponding to the five sections 611 through 615 are defined. When the SoC section 610 is more finely segmented, the SoC may be more precisely estimated. However, if the SoC section 610 is more finely segmented, a number of model parameters to be learned will increase and more sets of labeled segment data will be necessary.

A battery state estimating apparatus extracts a feature pattern of each label by varying the labels 621 through 625 in the corresponding sections 611 through 615.

In one example, a learner of the battery state estimating apparatus learns an SoC estimation model including an SoC label corresponding to an SoC section based on a predetermined interval, which is assigned to segment data obtained by segmenting a battery sensor signal of a reference battery at a predetermined time interval.

An actual battery sensor signal and a value of a corresponding SoC may be obtained through precise measurement. For example, when discharging a battery based on a predefined current profile, a value of an SoC corresponding to a battery sensor signal may be measured by performing a Coulomb counting method on an applied current using a charging and discharging apparatus. Then, the SoC estimation model is generated based on the obtained battery sensor signal and corresponding SoC measurement data. A discriminant feature space transformation model is generated using the SoC estimation model with respect to an SoC section.

The battery state estimating apparatus learns a feature data pattern corresponding to each SoC section in the SoC estimation model.

A state estimator of the battery state estimating apparatus performs pattern matching between a data pattern of segment data and a feature pattern of each SoC label. An SoC section corresponding to a feature pattern that most closely matches the data pattern of the segment data is estimated to be an SoC of a target battery for which the SoC is to be estimated.

The state estimator of the battery state estimating apparatus performs the pattern matching between a feature space transformation model and segment data, and estimates an SoC section corresponding to a feature space transformation model that most closely matches the segment data to be an SoC of a target battery for which the SoC is to be estimated.

Figure 7:
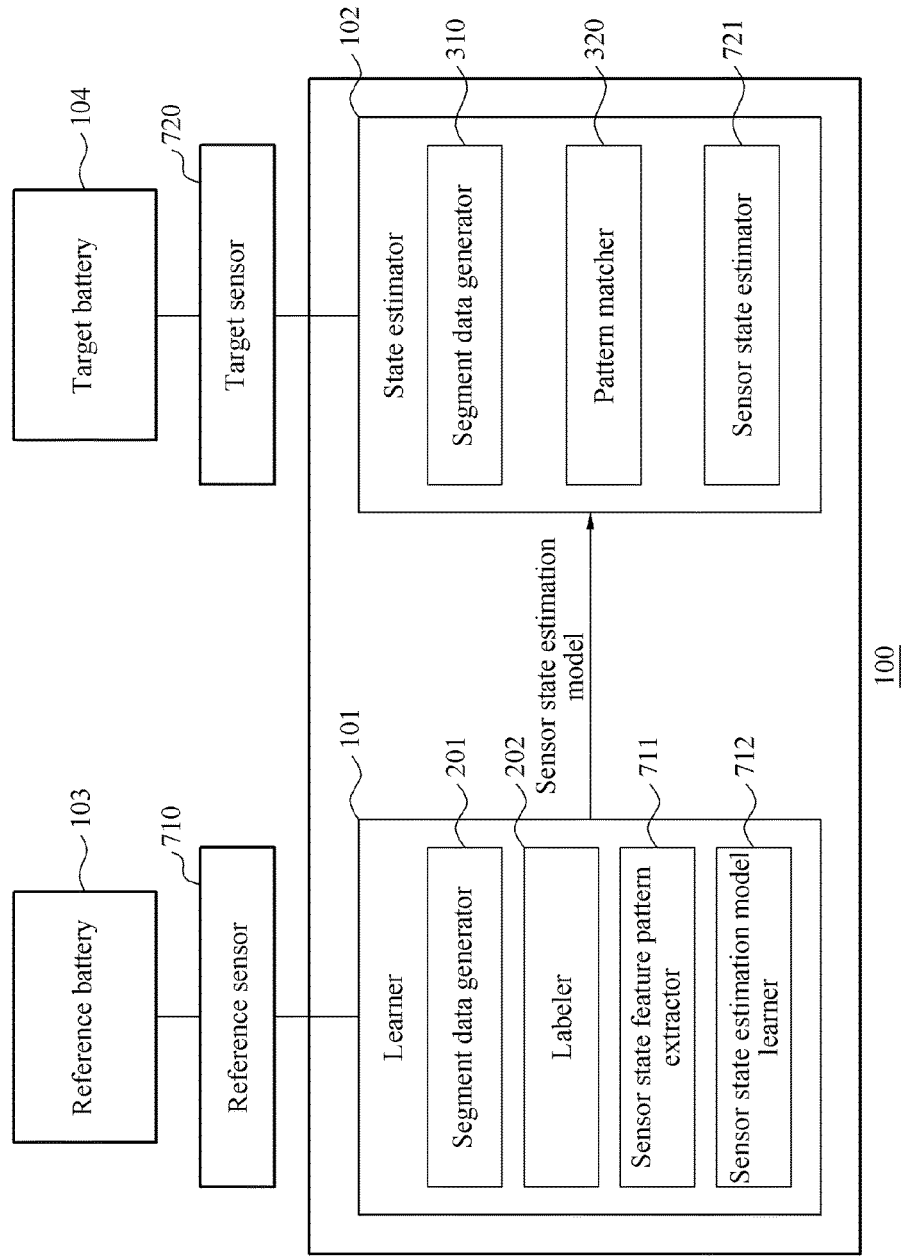
FIG. 7 is a diagram illustrating an example of a battery state estimating apparatus for estimating a sensor state.

FIG. 7 is a diagram illustrating an example of a battery state estimating apparatus 100 for estimating a sensor state.

Referring to FIG. 7, the battery state estimating apparatus 100 estimates a sensor state of a target sensor 720 using a sensor state estimation model learned using a reference sensor 710. The reference sensor 710 is a sensor configured to sense a battery sensor signal of a reference battery 103, and the target sensor 720 is a sensor configured to sense a battery sensor signal of a target battery 104.

The battery state estimating apparatus 100 estimates the sensor state of the target sensor 720. In general, a battery sensor signal is used to perform protective action circuit, SoC, and SoH estimating methods by a battery management system (BMS) of an electric vehicle. Actual data of a voltage, a current, a temperature, and other variables may differ from data measured by a sensor due to deterioration of sensor functions. A hardware error of the target sensor 720 may be detected using the battery state estimating apparatus 100.

Segment data of a battery sensor signal obtained during a normal operation of a sensor may have different patterns than segment data of a battery sensor signal obtained by a sensor in which an error has occurred. Using the battery state estimating apparatus 100, real-time error detection may be enabled by maximizing a difference between a battery sensor signal pattern in a normal state of the sensor and a battery sensor signal pattern in an abnormal state of the sensor.

In one example, the battery state estimating apparatus 100 includes a learner 101 and a state estimator 102. The learner 101 learns a sensor state estimation model including the battery sensor signal sensed from the reference battery 103 by the reference sensor 710 and a label corresponding to a sensor state. The state estimator 102 receives the sensor state estimation model learned by the learner 101, and estimates a sensor state of the target sensor 720 using the sensor state estimation model and the battery sensor signal sensed from the target battery 104 by the target sensor 720.

The learner 101 includes a segment data generator 201, a labeler 202, a sensor state feature pattern extractor 711, and a sensor state estimation model learner 712.

The learner 101 learns the sensor state estimation model using the battery sensor signal sensed from the reference battery 103 by the reference sensor 710.

The learner 101 collects the battery sensor signal sensed from the reference battery 103 by the reference sensor 710 and sensor state event information. The sensor state event information includes information on a normal state of a sensor or information as to whether an error has occurred in the sensor and when the error occurred.

The learner 101 obtains the sensor state event information indicating whether a state of the reference sensor 710 is a normal state or an error state. For example, when the reference sensor 710 is normally sensing the reference battery 103, the reference sensor 710 is in the normal state. When an error occurs while the reference sensor 710 is sensing the reference battery 103, the reference sensor 710 is in the error state.

The segment data generator 201 generates segment data by segmenting the battery sensor signal sensed from the reference battery 103 by the reference sensor 710 based on a predetermined time interval. The battery sensor signal includes any one or any combination of any two or more of voltage data, current data, temperature data, and pressure data of the reference battery 103.

The segment data generator 201 may include a preprocessor to preprocess the battery sensor signal sensed from the reference battery 103 by the reference sensor 710 before the segmenting to correct the battery sensor signal at a fixed sampling interval to force the battery sensor signal to have a predetermined amplitude for a predetermined period of time.

The labeler 202 assigns a label corresponding to the sensor state to the segment data. The possible sensor states include at least a normal sensor state and an abnormal sensor state. The labeler 202 assigns the label corresponding to the sensor state to the segment data to generate labeled segment data. For example, when the segment data indicates the abnormal sensor state, the labeler 202 assigns a sensor error label to the segment data to generate the labeled segment data.

The sensor state feature pattern extractor 711 extracts a feature pattern of each label corresponding to the sensor state using the labeled segment data generated by assigning the label corresponding to the sensor state to the segment data obtained by segmenting the battery sensor signal. The feature pattern of each label corresponding to the sensor state include a feature pattern of the normal sensor state and a feature pattern of the abnormal sensor state.

The sensor state estimation model learner 712 learns a sensor state estimation model including the feature pattern of each label corresponding to the sensor state.

The sensor state estimation model learner 712 generates, in advance, the sensor state estimation model through experimental representation of a sensor state to be measured. For example, when the sensor state to be measured is the abnormal sensor state, the sensor state estimation model learner 712 learns the sensor state estimation model using the reference sensor 710 in the abnormal sensor state. The sensor state estimation model learner 712 generates and learns the sensor state estimation model using a battery sensor signal of the abnormal sensor state. In one example, a feature space transformation model is generated by extracting a feature pattern of the battery sensor signal of the abnormal sensor state.

The state estimator 102 includes a segment data generator 310, a pattern matcher 320, and a sensor state estimator 721. The state estimator 102 estimates the sensor state of the target sensor 720 using the battery sensor signal sensed from the target battery 104 by the target sensor 720. The battery sensor signal includes any one or any combination of any two or more of voltage data, current data, temperature data, and pressure data of the target battery 104.

The segment data generator 310 generates segment data by segmenting the battery sensor signal sensed by the target sensor 720 based on a predetermined time interval.

The segment data generator 310 may include a preprocessor to preprocess the battery sensor signal sensed from the target battery 104 by the target sensor 720 before the segmenting to correct the battery sensor signal at a fixed sampling interval to force the battery sensor signal to have a predetermined amplitude for a predetermined period of time.

The pattern matcher 320 performs pattern matching between the sensor state estimation model learned by the learner 101 and the battery sensor signal sensed by the target sensor 720. The pattern matcher 320 performs the pattern matching between the feature space transformation model corresponding to the feature pattern of the sensor state estimation model and the segment data of the target battery 104.

The pattern matcher 320 measures a degree of similarity between the battery sensor signal sensed by the target sensor 720 and the feature space transformation model of each sensor state pre-learned by the learner 101. The pattern matcher 320 transmits, to the sensor state estimator 721, a label corresponding to a most closely matching battery state.

In one example, the pattern matcher 320 calculates a Euclidean distance between the label corresponding to the sensor state and the learned feature pattern, and estimates a current sensor state based on a most closely matching label. In another example, the pattern matching may be performed using an SVM classifier, a neural network classifier, a decision tree classifier, a linear or nonlinear regression method, or any other pattern matching method known to one of ordinary skill in the art.

The sensor state estimator 721 estimates the sensor state based on a result of the pattern matching. In one example, the sensor state estimator 721 estimates the current sensor state using the label transmitted from the pattern matcher 320 and corresponding to the most closely matching sensor state.

In another example, when the sensor state estimation model matches segment data of a battery sensor signal obtained in real time, the sensor state estimator 721 estimates a sensor state corresponding to the sensor state estimation model.

The sensor state estimator 721 estimates in real time a sensor state corresponding to segment data of a battery sensor signal using a pre-learned optimal feature space transformation model. The learned feature space transformation model is obtained by the learner 101.

Figure 8:
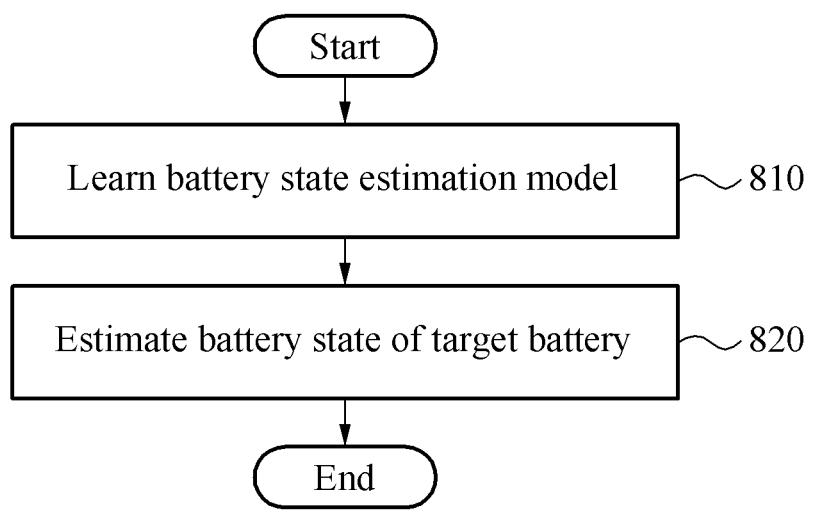
FIG. 8 is a flowchart illustrating an example of a battery state estimating method.

FIG. 8 is a flowchart illustrating an example of a battery state estimating method. The battery state estimating method described hereinafter is performed by a battery state estimating apparatus.

Referring to FIG. 8, in operation 810, the battery state estimating apparatus learns a battery state estimation model.

The battery state estimating apparatus obtains a battery sensor signal of a reference battery. The battery state estimating apparatus segments the battery sensor signal. The battery state estimating apparatus may preprocess the battery sensor signal and segment the preprocessed battery sensor signal. In one example, the battery state estimating apparatus corrects the battery sensor signal at a fixed sampling interval to force the battery sensor signal to have a predetermined amplitude for a predetermined period of time, and segments the battery sensor signal into sets of segment data at a predetermined time interval.

The battery state estimating apparatus assigns a label corresponding to a battery state to the segment data, and generates a battery state estimation model of each label and learns the generated battery state estimation model.

The battery state estimating apparatus extracts a discriminant feature pattern corresponding to each label using a label corresponding to a battery state to be estimated. The discriminant feature pattern is stored as a feature space transformation model for each battery state.

Operation 810 will be further described with reference to FIG. 9.

In operation 820, the battery state estimating apparatus estimates a battery state of a target battery using the learned battery state estimation model.

The battery state estimating apparatus performs pattern matching. The pattern matching is performed between the segment data and the feature space transformation model of the battery state to be estimated among the feature space transformation models learned for each battery state.

The battery state estimating apparatus estimates the battery state of the target battery based on a result of the pattern matching. The estimating of the battery state includes estimating a battery state having a most closely matching pattern as a result of the pattern matching to be a current battery state.

Operation 820 will be further described with reference to FIG. 10.

Figure 9:
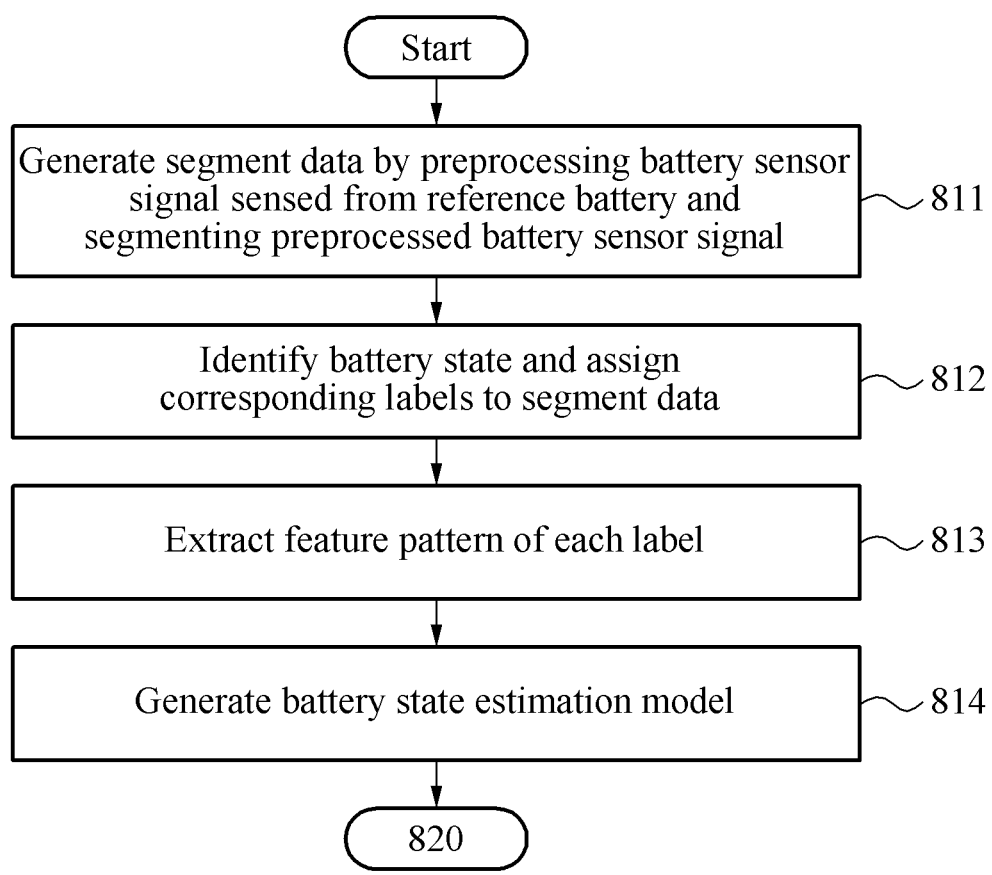
FIG. 9 is a flowchart illustrating an example of a process of learning a battery state estimation model in a battery state estimating method.

FIG. 9 is a flowchart illustrating an example of a process of learning a battery state estimation model in a battery state estimating method.

Referring to FIG. 9, in operation 811, a battery state estimating apparatus generates segment data by preprocessing a battery sensor signal sensed from a reference battery and segmenting the preprocessed battery sensor signal.

In operation 811, the battery state estimating apparatus preprocesses the battery sensor signal sensed from the reference battery and segments the preprocessed battery sensor signal. In one example, the battery state estimating apparatus corrects the battery sensor signal at a fixed sampling interval to force the battery sensor signal to have a predetermined amplitude for a predetermined period of time, and segments the battery sensor signal into sets of segment data at a predetermined time interval. The battery sensor signal includes any one or any combination of any two or more of voltage data, current data, temperature data, and pressure data of the reference battery sensed by a sensor configured to sense the reference battery.

In another example, the preprocessing in operation 811 may be omitted, and the battery state estimating apparatus may generate the segment data in operation 811 by segmenting the battery sensor signal sensed from the reference battery based on a predetermined time interval.

In operation 812, the battery state estimating apparatus identifies a battery state and assigns a label corresponding to the identified battery state to the segment data.

The battery state estimating apparatus assigns the label corresponding to the battery state to the segment data. The battery state includes any one or any combination of any two or more of an SoH, an SoC, an SoF, and a fault state. The battery state estimating apparatus assigns the label corresponding to the battery state to the segment data to generate the labeled segment data. For example, when the battery state of the segment data is an error state, the battery state estimating apparatus generates the labeled segment data by assigning an error label to the segment data.

The battery state estimating apparatus generates battery state information by identifying the battery state of the reference battery. The battery state information is information on the battery state of the reference battery. For example, the battery state information includes information as to whether the battery state is a normal state or an abnormal state, and a time section that corresponds to the battery state.

The battery state information includes information on whether an abnormal battery state occurs and when the abnormal battery state occurs. Thus, the battery state information may be used to identify the battery state of the reference battery.

The battery state information is obtained through experimental representation of a battery state by performing in advance experiments using a battery state measuring apparatus. For example, battery state information on an overdischarge abnormal state may be obtained by performing an experiment in which a battery is overdischarged. By performing such an experiment, a battery state estimation model of the overdischarge abnormal state may be obtained. In another example, when a battery is actually provided in a product such as a smartphone or an electric vehicle and the product is operating, a battery state estimation model may be obtained by discovering an abnormal state from a failure of the battery.

The battery state estimating apparatus assigns the label corresponding to the battery state of the reference battery to the segment data of the reference battery. When an abnormal state occurs, the battery state estimating apparatus assigns a label corresponding to the abnormal state to the segment data. When a normal state occurs, the battery state estimating apparatus assigns a label corresponding to the normal state to the segment data.

In operation 813, the battery state estimating apparatus extracts a feature pattern of each label.

The battery state estimating apparatus extracts a discriminant feature pattern from labeled segment data corresponding to a battery state to be estimated among sets of the labeled segment data. For example, when the battery state to be estimated is an error state, the battery state estimating apparatus extracts a feature pattern from labeled segment data including an error state label.

In operation 814, the battery state estimating apparatus generates a battery state estimation model.

The battery state estimating apparatus generates the battery state estimation model corresponding to the feature pattern of each label using a discriminant analysis method. The battery state estimating apparatus generates a feature space transformation model. The battery state estimating apparatus generates the feature space transformation model for the battery state to be estimated using the discriminant analysis method based on collected sets of the labeled segment data. The battery state estimating apparatus generates the feature space transformation model, as the battery state estimation model, using the discriminant analysis method.

Figure 10:
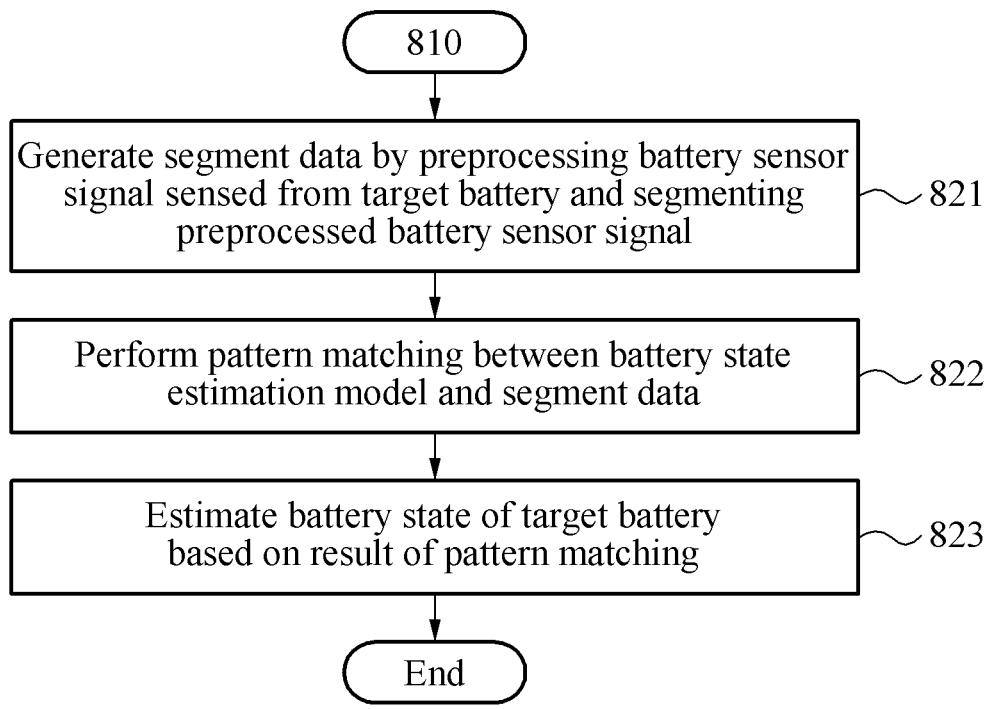
FIG. 10 is a flowchart illustrating an example of a process of estimating a battery state in a battery state estimating method.

FIG. 10 is a flowchart illustrating an example of a process of estimating a battery state in a battery state estimating method.

Referring to FIG. 10, in operation 821, a battery state estimating apparatus generates segment data by preprocessing a battery sensor signal sensed from a target battery, and segmenting the preprocessed battery sensor signal. In one example, the battery state estimating apparatus corrects the battery sensor signal at a fixed sampling interval to force the battery sensor signal to have a predetermined amplitude for a predetermined period of time, and segments the battery sensor signal into sets of segment data at a predetermined time interval. The battery sensor signal includes any one or any combination of any two or more of voltage data, current data, temperature data, and pressure data of the target battery sensed by a sensor configured to sense the target battery.

In another example, the preprocessing in operation 821 may be omitted, and the battery state estimating apparatus may generate the segment data in operation 821 by segmenting the battery sensor signal sensed from the target battery based on a predetermined time interval.

In operation 822, the battery state estimating apparatus performs pattern matching between a battery state estimation model and the segment data of the target battery. When a battery state to be estimated is an error state, the battery state estimating apparatus performs the pattern matching between a battery state estimation model corresponding to the error state and the segment data of the target battery. When a battery state estimating model assigned with an error label most closely matches the segment data of the target battery, the battery state of the target battery is estimated as the error state.

The battery state estimating apparatus calculates a Euclidean distance between the segment data of the target battery and a learned feature pattern, and estimates a current battery state as a battery state label having a shortest distance. Alternatively, the pattern matching may be performed using an SVM classifier, a neural network classifier, a decision tree classifier, a linear or nonlinear regression method, or any other pattern matching method known to one of ordinary skill in the art.

In operation 823, the battery state estimating apparatus estimates the battery state of the target battery. The battery state estimating apparatus estimates the current battery state using a battery state label most closely matching the segment data of the target battery.

Furthermore, the battery state estimating apparatus may estimate a sensor state of a target sensor measuring the battery sensor signal of the target battery in the manner described above in connection with FIG. 7.

The learner 101 in FIGS. 1, 2, and 7, the state estimator 102 in FIGS. 1, 3, and 7, the segment data generator 201 and the labeler 202 in FIGS. 2 and 7, the pattern extractor 203 and the battery state estimation model generator 204 in FIG. 2, the segment data generator 310, the pattern matcher 320, and the battery state estimator 330 in FIGS. 3 and 7, and the sensor state feature pattern extractor 711, the sensor state estimation model learner 712, and the sensor state estimator 721 in FIG. 7 that perform the operations described herein with respect to FIGS. 1-10 are implemented by hardware components. Examples of hardware components include controllers, generators, drivers, memories, comparators, arithmetic logic units, adders, multipliers, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-10. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 8-10 that perform the operations described herein with respect to FIGS. 1-10 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMS, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state estimating apparatus comprising:
    a learner configured to learn a battery state estimation model, the battery state estimation model comprising labels corresponding to battery states for segment data generated by segmenting a battery sensor signal of a reference battery, wherein the learner comprises a battery state estimation model generator configured to generate, as the battery state estimation model, a feature space transformation model corresponding to a feature pattern of each of the labels; and
    a state estimator configured to estimate a battery state of a target battery using the battery state estimation model.

2. The apparatus of claim 1, wherein the learner further comprises:
    a segment data generator configured to generate the segment data by segmenting the battery sensor signal of the reference battery based on a predetermined time interval;
    a labeler configured to assign, to each of the segment data, the label corresponding to the battery state; and
    a pattern extractor configured to extract the feature pattern of each of the labels from the labeled segment data.

3. The apparatus of claim 1, wherein the battery state estimation model generator is configured to generate the battery state estimation model using a discriminant analysis method.

4. The apparatus of claim 2, wherein the battery sensor signal comprises any one or any combination of any two or more of voltage data, current data, temperature data, and pressure data of the reference battery in a time-series space.

5. The apparatus of claim 2, wherein the segment data generator comprises a preprocessor configured to correct the battery sensor signal at a fixed sampling interval before the segmenting of the battery sensor signal.

6. The apparatus of claim 1, wherein the state estimator comprises:
a segment data generator configured to generate segment data by segmenting a battery sensor signal of the target battery based on a time interval;
a pattern matcher configured to perform pattern matching between the battery state estimation model and the segment data of the target battery; and
a battery state estimator configured to estimate the battery state of the target battery based on a result of the pattern matching.

7. The apparatus of claim 6, wherein the pattern matcher is further configured to perform the pattern matching between a feature pattern of a battery state estimation model corresponding to a battery state to be estimated and a data pattern of the segment data of the target battery, and
the battery state estimator is further configured to estimate, as the battery state of the target battery, a battery state corresponding to a feature pattern most closely matching the data pattern of the segment data of the target battery.

8. The apparatus of claim 1, wherein the battery state comprises a state of charge (SoC),
the learner is further configured to learn an SoC estimation model comprising SoC labels respectively corresponding to SoC sections based on a interval, and
the state estimator is further configured to estimate an SoC of the target battery by comparing the SoC estimation model to segment data of the target battery obtained by segmenting a battery sensor signal of the target battery based on a time interval.

9. The apparatus of claim 8, wherein the learner is further configured to extract a feature pattern of each of the SoC labels from the SoC estimation model, and
the state estimator is further configured to perform pattern matching between a data pattern of the segment data and the feature pattern of each of the SoC labels, and estimate, as the SoC of the target battery, an SoC section corresponding to a feature pattern most closely matching the data pattern of the segment data.

10. The apparatus of claim 1, wherein the learner comprises a sensor state estimation model learner configured to learn a sensor state estimation model comprising labels corresponding to sensor states, and
the state estimator comprises a sensor state estimator configured to estimate a sensor state of a sensor measuring a battery sensor signal of the target battery using the sensor state estimation model.

11. The apparatus of claim 10, wherein the learner further comprises a sensor state feature pattern extractor configured to extract a feature pattern of each of the labels corresponding to the sensor states, and
the sensor state estimator is further configured to perform pattern matching between the feature pattern of each of the labels corresponding to the sensor states and a data pattern of segment data of the target battery obtained by segmenting the battery sensor signal of the target battery based on a time interval, and estimate a sensor state corresponding to the feature pattern as the sensor state of the sensor measuring the battery sensor signal of the target battery based on a result of the pattern matching.

12. A battery state estimating method comprising:
learning a battery state estimation model, the battery state estimation model comprising labels corresponding to battery states for segment data generated by segmenting a battery sensor signal of a reference battery, wherein the learning of the battery state estimation model comprises generating, as the battery state estimation model, a feature space transformation model corresponding to a feature pattern of each of the labels; and
estimating a battery state of a target battery using the battery state estimation model.

13. The method of claim 12, wherein the learning of the battery state estimation model further comprises:
generating the segment data by segmenting the battery sensor signal of a-the reference battery based on a predetermined time interval;
assigning, to each of the segment data, the label corresponding to the battery state; and
extracting the feature pattern of each of the labels from the labeled segment data.

14. The method of claim 12, wherein the battery state estimation model is configured to be generated using a discriminant analysis method.

15. The method of claim 12, wherein the estimating of the battery state comprises:
generating segment data by segmenting a battery sensor signal of the target battery based on a time interval;
performing pattern matching between the battery state estimation model and the segment data of the target battery; and
estimating the battery state of the target battery based on a result of the pattern matching.

16. The method of claim 15, wherein the performing of the pattern matching comprises performing pattern matching between a feature pattern of a battery state estimation model corresponding to a battery state to be estimated and a data pattern of the segment data of the target battery, and
the estimating of the battery state comprises estimating, as the battery state of the target battery, a battery state corresponding to a feature pattern most closely matching the data pattern of the segment data of the target battery.

17. The method of claim 12, wherein the battery state comprises a state of charge (SoC),
the learning of the battery state estimation model comprises learning an SoC estimation model comprising SoC labels respectively corresponding to SoC sections based on a interval, and
the estimating of the battery state comprises estimating an SoC of the target battery by comparing the SoC estimation model to segment data of the target battery obtained by segmenting a battery sensor signal of the target battery based on a time interval.

18. The method of claim 17, wherein the learning of the battery state estimation model comprises extracting a feature pattern of each of the SoC labels from the SoC estimation model, and
the estimating of the battery state further comprises performing pattern matching between a data pattern of the segment data and the feature pattern of each of the SoC labels, and estimating, as the SoC of the target battery, an SoC section corresponding to a feature pattern most closely matching the data pattern of the segment data.

19. The method of claim 12, wherein the learning of the battery state estimation model comprises learning a sensor state estimation model comprising labels corresponding to sensor states, and the estimating of the battery state comprises estimating a sensor state of a sensor measuring a battery sensor signal of the target battery using the sensor state estimation model.

20. The method of claim 19, wherein the learning of the sensor state estimation model comprises extracting a feature pattern of each of the labels corresponding to the sensor states, and the estimating of the sensor state comprises performing pattern matching between the feature pattern of each of the labels corresponding to the sensor states and a data pattern of segment data of the target battery obtained by segmenting the battery sensor signal of the target battery based on a time interval, and estimating a sensor state corresponding to the feature pattern as the sensor state of the sensor measuring the battery sensor signal of the target battery based on a result of the pattern matching.

* * * * *